United States Patent [19]

Suzuki et al.

[11] 4,392,069
[45] Jul. 5, 1983

[54] SEMICONDUCTOR SWITCH

[75] Inventors: Masayoshi Suzuki, Hitachiota; Akio Sagawa, Hitachi, both of Japan

[73] Assignee: Hitachi, Ltd., Tokyo, Japan

[21] Appl. No.: 170,180

[22] Filed: Jul. 18, 1980

[30] Foreign Application Priority Data

Jul. 20, 1979 [JP] Japan .................................. 54-91524

[51] Int. Cl.³ ...................... H03K 17/72; H03K 17/16
[52] U.S. Cl. .............................. 307/252 A; 307/252 J; 307/305; 357/20; 357/35; 357/38; 357/39
[58] Field of Search .......... 307/252 A, 252 D, 252 G, 307/252 J, 305; 357/35, 38, 39, 20

[56] References Cited

U.S. PATENT DOCUMENTS

| | | | |
|---|---|---|---|
| 3,609,413 | 9/1971 | Lane et al. | 307/252 H |
| 4,015,143 | 3/1977 | Tokunaga et al. | 307/252 A |
| 4,063,115 | 12/1977 | Okuhara et al. | 307/252 G |
| 4,184,086 | 1/1980 | Sagawa et al. | 307/252 G |

*Primary Examiner*—John Zazworsky
*Attorney, Agent, or Firm*—Antonelli, Terry & Wands

[57] ABSTRACT

In semiconductor switches, erroneous firing is often a serious problem. To overcome this, a semiconductor switch is provided which includes a thyristor of PNPN structure with three PN junctions and with anode, cathode and gate electrodes, a first transistor for short-circuiting at least one PN junction of said thyristor upon its saturation, and a second transistor provided between the anode side or cathode side of the thyristor and the base of said first transistor to cause saturation of the first transistor in accordance with the voltage which is applied to the anode or cathode of the thyristor. The ratio of the time constant of the second transistor to that of said thyristor is not substantially less than 0.5. This ratio is established by using similar plane diffused patterns for the second transistor and a third transistor which is defined by three continuous layers of the thyristor.

20 Claims, 29 Drawing Figures

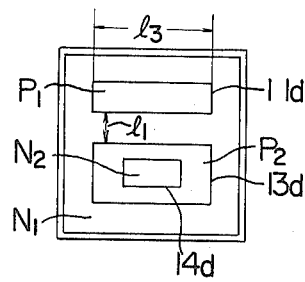
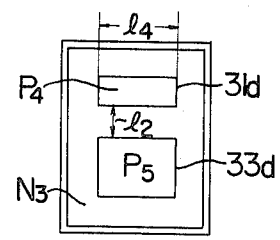
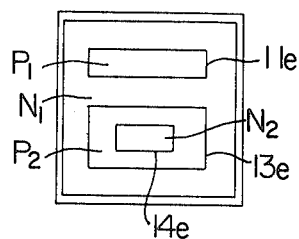
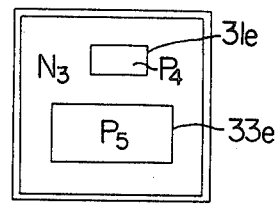
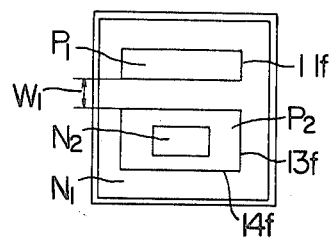
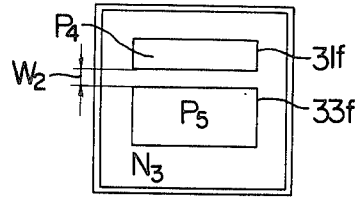
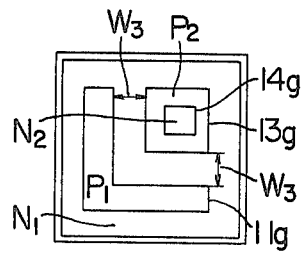
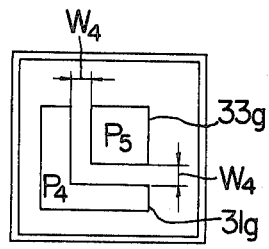

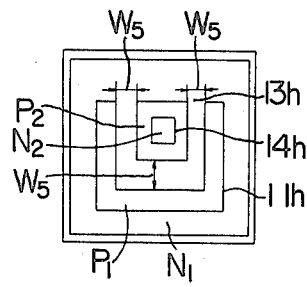
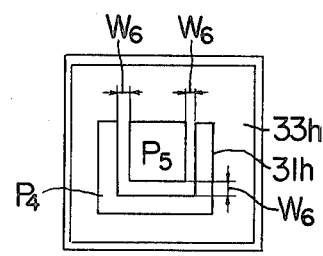
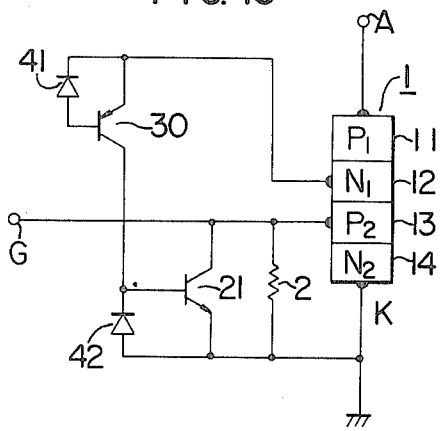
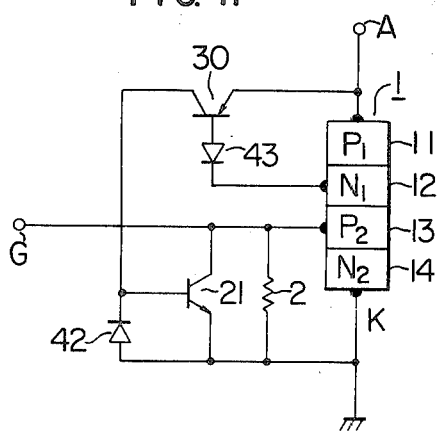
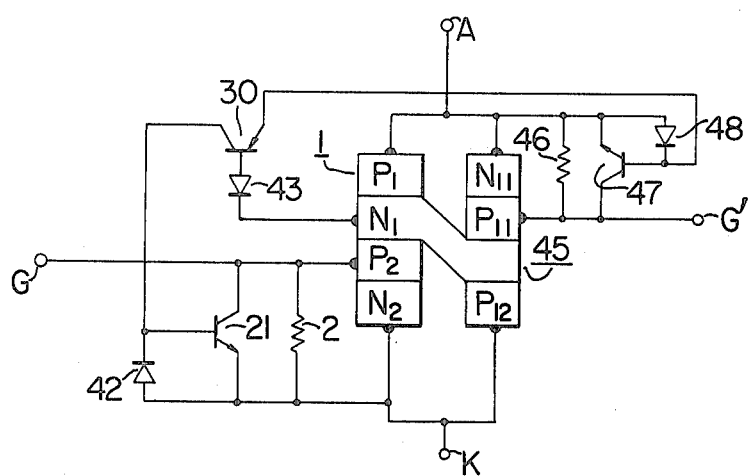

SEMICONDUCTOR SWITCH

The present invention relates to semiconductor switches using PNPN switches, and particularly to the structure of a semiconductor switch capable of enhancing the effect of preventing a malfunction of the switch due to noise voltage.

In general, the semiconductor switch of four-layer structure called the PNPN switch, thyristor or the like is erroneously turned on when a forward voltage is suddenly applied across the semiconductor switch (between anode and cathode) even under the cutoff state. This is called the rate effect and its minimum strength sufficient for misfiring the thyristor is called the dv/dt firing capability.

To prevent this erroneous turning-on, a resistor (its value, $R_{GK}$) is connected between the gate and cathode of the PNPN four-layer switching element (hereinafter referred to as the thyristor). This short-circuiting method is called a "short-emitter".

In order to improve a dv/dt firing capability by this method, it is necessary to reduce the value of the resistor. This results in an inevitable decrease of the gate sensitivity. In other words, if the resistance value $R_{GK}$ is decreased, the displacement current flowing through the junction capacitance between the cathode and anode when noise voltage is applied therebetween almost all flows in the resistor with the result that the voltage between the gate and cathode does not exceed the built-in voltage (about 0.7 V) of the thyristor thereby to prevent the erroneous operation thereof. However, in case of turning on the thyristor, the firing current from the gate also almost all flows into the resistor and thus the current necessary for the turning-on increases.

That is, if the resistance value $R_{GK}$ is reduced for increase of the stability of the element to noise, the gate firing current is increased to thereby reduce the sensitivity of the thyristor. This is undesirable in that the power necessary for firing the thyristor increases.

Therefore, it becomes necessary to provide a thyristor circuit with a small gate firing current and with a good dv/dt firing capability (i.e. high in a firing voltage between the anode and cathode of the thyristor), and thus as a remedy therefore the circuit arrangement as shown in FIG. 1 has been used so far.

Such a circuit is disclosed in the "Semiconductor switch" of the U.S. Application Ser. No. 556326 by Michio Tokunaga et al which was filed on Mar. 7, 1975, issued on Mar. 29, 1977 as U.S. Pat. No. 4015143 and assigned to the assignee common to this application.

In the circuit of FIG. 1, a transistor 21 is connected between the gate G and cathode K of a thyristor 1, and a transistor 30 between the base of the transistor 21 and a N-base 11 of the thyristor 1.

The thyristor 1 is of the four layer structure of P-type emitter ($P_1$) 11, N-type emitter ($N_2$) 14, N-type base ($N_1$) 12, and P-type base ($P_2$) 13, and is turned on by the gate G of the P-type base 13.

The transistor 21 is formed by an N-type collector ($N_4$) 25, a P-type base ($P_6$) 26 and an N-type emitter ($N_5$) 27. The transistor 30 is formed by a P-type emitter ($P_4$) 31, an N-type base ($N_3$) 32, a P-type collector ($P_5$) 33.

In the circuit of FIG. 1, when a noise voltage pulse is applied to the anode A of the thyristor 1, the transient voltage is differentiated by the capacitance of the collector-base junction of the transistor 30, and the current obtained from this differentiation drives the transistor 21. Simultaneously, the transistor 21 is brought into saturation from the nonconducting state, short-circuiting the path between the gate G and cathode K of the thyristor 1. The collector-emitter shunt resistance of the transistor 21 in this case can be considerably reduced as compared with the value of a resistor 2, thereby improving the dv/dt firing capability.

If noise voltage pulse is not applied to the anode A, the transistor 21 is in the cutoff (nonconducting) state, and thus the resistance between the gate G and cathode K is only the value $R_{GK}$ of the resistor 2. The resistance $R_{GK}$ can be selected to be relatively high (enough to absorb the leak current in the thyristor due to temperature), and thus contributes to a low gate firing current.

The operation of the circuit of FIG. 1 will now be described briefly. FIG. 2 shows the voltage and current waveforms of each part when the thyristor 1 as shown in FIG. 1 is supplied at its anode A with a noise voltage $v_A$ of a ramp shape (the rising slope is constant). In FIG. 2, $i_J$ represents the current flowing through the thyristor 1, $i_B$ the current through the transistor 30 and $v_G$ the gate voltage of the thyristor 1. FIG. 3 is an equivalent circuit of the circuit of FIG. 1. The circuit of FIG. 3 includes a PNP transistor 15 consisting of $P_1$, $N_1$ and $P_2$ of the thyristor 1, a second junction capacitance $C_J$ and an N base-ground capacitance $C_{NG}$ of the thyristor. Reference characters $h_P$ and $h_D$ represent current amplification factors of transistors 15 and 30, respectively $\tau_1$ and $\tau_2$ fall time constants of the transistors 15 and 30, respectively, and k is the slope rate of the ramp voltage.

At time $t_0$, when the noise voltage pulse $v_A$ rises, most of the noise voltage is applied between the electrodes ($N_1$) 12 and ($P_2$) 13 of the thyristor 1 and between the electrodes ($N_3$) 32 and ($P_5$) 33 of the transistor 30. The other PN junctions are not supplied with the noise voltage because they are forward biased. If the capacitance of the PN junctions ($N_3P_5$) of the transistor 30 is taken as $C_D$, the current $i_J$ flowing through the junction between the electrodes ($N_1$) 12 and ($P_2$) 13 of the thyristor 1 and the current $i_B$ flowing through the transistor 30 are given by $$i_J = C_J \frac{dv}{dt} \quad (1)$$

$$i_B = C_D \frac{dv}{dt} \quad (2)$$

where v represents the voltage applied to the PN junctions and substantially equals to the voltage $v_A$. Since the voltage $v_A$ is the ramp shape during the period ($t_0$ to $t_1$) as shown in FIG. 2, the dv/dt value is constant k ($v = v_A = kt$). Thus, the currents $i_J$ and $i_B$ are rewritten as $$i_J = C_J k \quad (3)$$

$$i_B = C_D k \quad (4)$$

When these currents are generated, the transistor 21 is instantly turned on to be in saturation, with the result that most of the transient current $i_J$ from the thyristor 1 flows into the collector of the transistor 21. Thus, the value $V_{GS}$ of the voltage $v_G$ at the gate G is reduced to as low as the collector-emitter saturation voltage and for lower than the gate-cathode conducting voltage $V_B$ of the thyristor. Therefore, during this period, erroneous firing does not occur due to the noise voltage pulse.

The currents $i_J$ and $i_B$ expressed by Eqs. (3) and (4) are displacement currents flowing through the PN junctions, and permit small conducting currents to flow through the thyristor 1 and the transistor 30. During the period $T_1$ ($t_0$ to $t_1$), the PNP transistor of the structure $P_1N_1P_2$ becomes active in the thyristor 1.

The base current of the PNP transistor ($P_1N_1P_2$), i.e. the current flowing through the N base 12, is the sum of the currents $i_J$ and $i_B$. The conduction current $i_{JD}$ of the thyristor 1 is given by $$i_{JD} = C_J k\, h_P (1 - \epsilon^{-t/\tau_1}) \qquad (5)$$

where $\tau_1$ is a fall time constant of the transistor 15 ($P_1N_1P_2$) and the reciprocal of a cut-off angular frequency. Also, the conduction current $i_{BD}$ flowing through the transistor 30 is given by $$i_{BD} = C_D k\, h_D (1 - \epsilon^{-t/\tau_2}) \qquad (6)$$

The values of the currents $i_{JD}$ and $i_{BD}$ are smaller than those of the currents $i_J$ and $i_B$ since $h_D$ is considerably smaller than 1. When the noise voltage pulse reaches the maximum, the currents $i_J$ and $i_B$ are immediately reduced to zero, and only the conducting currents in the thyristor 1 and the transistor 30 remain at the PN junctions.

If the conduction currents at this time are represented by $I_{JD}$ and $I_{BD}$, they are given by $$I_{JD} = C_J k\, h_P (1 - \epsilon^{-T_1/\tau_1}) \qquad (7)$$

$$I_{BD} = C_D k\, h_D (1 - \epsilon^{-T_1/\tau_2}) \qquad (8)$$

After time $t_1$, the currents $i_B$ and $i_J$ decrease with time as given by following equations.

$$i_J = I_{JD} \epsilon^{-t/\tau_1} \qquad (9)$$

$$i_B = I_{BD} \epsilon^{-t/\tau_2} \qquad (10)$$

where t shows a period after the time point $t_1$. Even though the transient voltage (noise voltage pulse) has risen up at time $t_1$, the transistor 21 continues to be in saturation, due to the storage effect of carriers in the transistor 21. When the carriers due to the storage effect disappear at time $t_2$, the transistor 21 becomes active to restore the resistivity to a voltage in its collector junction. This operation can be supposed from the equivalent circuit of FIG. 4, and at $t_3$ the switch SW can be considered to open. The period of time $t_1$ to $t_2$ is called a storage time, the value of which is represented here by Ts.

If the currents $i_B$ and $i_J$ near the time $t_2$ are represented by $I_B$ and $I_J$ respectively, the currents $I_B$ and $I_J$ are given as follows since the storage effect disappears near the time $t_2$.

$$I_J \approx I_{JD} \epsilon^{-Ts/\tau_1} \qquad (11)$$

$$I_B \approx I_{BD} \epsilon^{-Ts/\tau_2} \qquad (12)$$

Since the transistor 21 is in saturation before time $t_2$, the collector-emitter voltage (which equals to the gate voltage $v_G$ of the transistor 21) is very low. After $t_2$, the current $i_J$ can not flow into the collector of the transistor 21, but instead to the resistor 2, and therefore the peak voltage $V_G$ has a peak as shown in FIG. 2. When the peak voltage $V_P$ exceeds the gate-cathode built-in voltage $V_B$ of the thyristor as shown by a dotted line in FIG. 2, the thyristor 1 is turned on to vary the voltage $V_A$ and the current $i_J$ as shown by dotted lines in FIG. 2. This turning-on is erroneous to degrade the reliability of the operation of the element.

The peak value $V_P$ of the gate voltage $V_G$ is given by $$V_P \approx (i_J - h_Q i_B) R_{GK} \qquad (13)$$

where $h_Q$ represents the current amplification factor of the transistor 21. The lower the value of the voltage $V_P$, the wider the voltage difference from the $V_P$ to the $V_B$, so that the erroneous firing is usually prevented by properly selecting the values in Eq. (13). Since decrease of the voltage $V_P$ will decrease the possibility of the erroneous firing, it is general practice to decrease the $R_{GK}$ or increase the $h_Q$. However, the decrease of the voltage $V_P$ is limited since the changes of such circuit constants are limited.

From the waveforms of currents $i_J$ and $i_B$ of FIG. 2, it will be evident that to reduce the voltage $V_P$, the current $i_J$ is rapidly attenuated and the current $i_B$ flows for a long period of time. To this end, it has been tried that the structure of the semiconductor element (thyristor, transistor) is changed to design the time constant $\tau$ (carrier fall time) of the $P_1N_1P_2$ of the thyristor 1, and the fall time constant $\tau_2$ of the transistor 30. However, these values are widely changed depending on various conditions, particularly on the external conditions such as temperature, moisture, and the like, so that it is difficult to prevent the erroneous turning-on.

Moreover, it has been proposed that a new circuit element is added to extend the period during which the current $i_B$ flows, but this proposition has a drawback of complicating the circuit construction.

Now, from the equations (11), (12) and (13), a following equation is obtained.

$$V_P = R_{GX}(I_{JD} \epsilon^{-Ts/\tau_1} - h_Q I_{BD} \epsilon^{-Ts/\tau_2}) \qquad (14)$$

It is apparant from this equation that the voltage $V_P$ can be small if $\tau_1$ is made smaller relative to $\tau_2$.

The present inventors have found from the equation (14) that if the ratio of time constants $\tau_1$ and $\tau_2$ is brought within a constant range, the gate voltage $V_P$ of the thyristor can be restricted to the built-in voltage $V_B$ or below and the variation of $V_P$ can be limited to a minimum value irrespective of the change of various conditions. Then, the inventors have proposed that the plane patterns of the semiconductor elements, or thyristor 1 and the transistor 30 are made similar shape in a certain range. Thus, if the plane patterns have similarity, the characteristics of the thyristor 1 and transistor 30 (for example, time constants, $\tau_1$ and $\tau_2$) can be changed at a certain rate upon change of conditions, and the variation of the voltage $V_P$ can be made as small as possible, thereby preventing the thyristor 1 from being erroneously turned on.

Accordingly, it is an object of the invention to provide a semiconductor switch with the conventional drawback obviated and which is designed to prevent the erroneous firing without the addition of a new circuit element.

According to the present invention, the structure of the semiconductor element is designed to have a similar relation so that the ratio of the time constants of the semiconductor elements can be set within a certain range, thereby enabling the semiconductor switch to be prevented from erroneous firing irrespective of the variation of various conditions such as temperature and the like.

Some ways of carrying out the invention will be described in detail below with reference to drawings which illustrate specific embodiments in which:

FIGS. 11A and 11B are another embodiment of the thyristor and transistor according to the invention, respectively;

FIGS. 12A and 12B are still another embodiment of the thyristor and transistor according to the invention;

FIGS. 13A, 13B, 14A, 14B, 15A and 15B are plan views of another embodiment of the invention;

FIGS. 16, 17 and 18 are circuit diagrams of preferred modifications of the semiconductor switch according to the invention;

Figure 19:
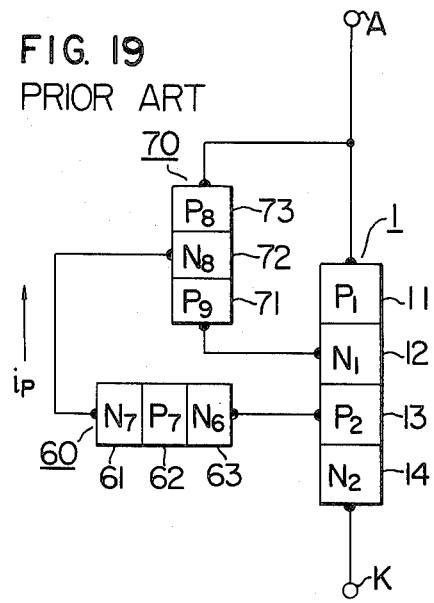
FIG. 19 is another short-emitter circuit diagram of the conventional thyristor.
Figure 20:
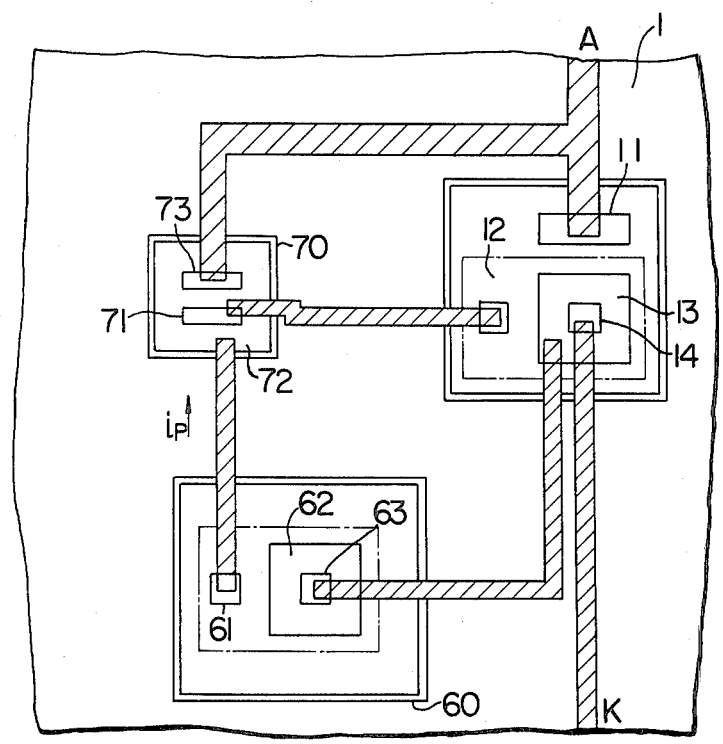
FIG. 20 is a plan view of the dielectric isolation separating substrate on which the circuit of FIG. 19 is integrated according to the invention.
Figure 19:
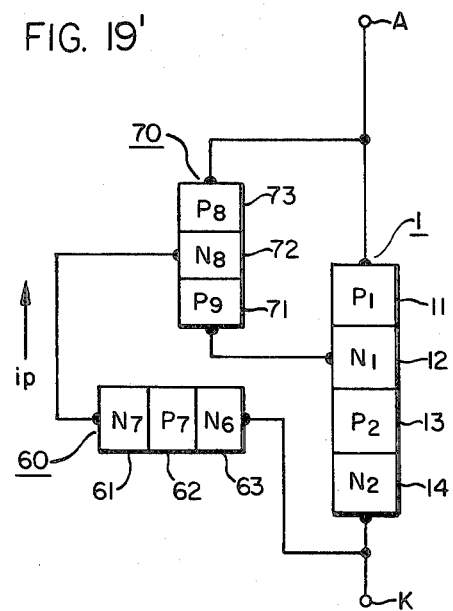
Figure 20:
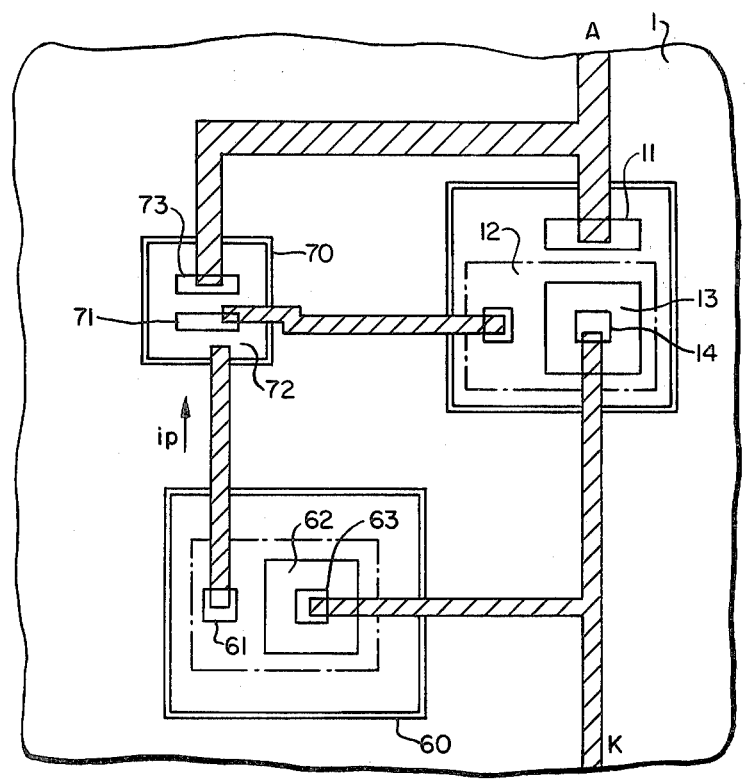
Figure 21:
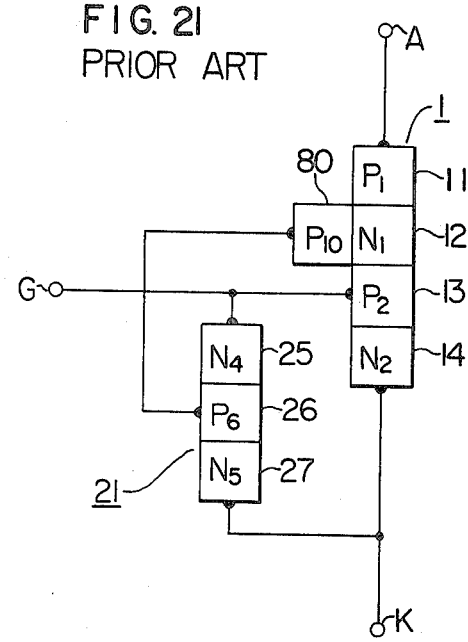
Figure 22:
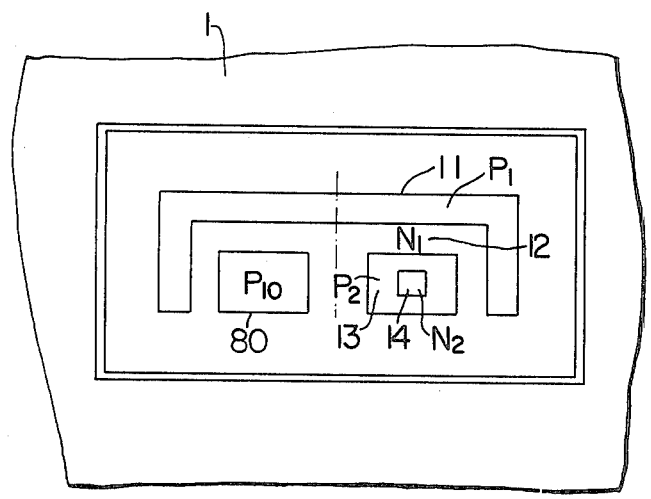

FIGS. 19' and 20' are modifications of FIGS. 19 and 20;

FIG. 21 is still another short-emitter circuit diagram of the conventional thyristor; and FIG. 22 is a partial plan view of the dielectric insulation separating substrate on which the circuit of FIG. 21 is integrated in accordance with the invention.

Figure 5:
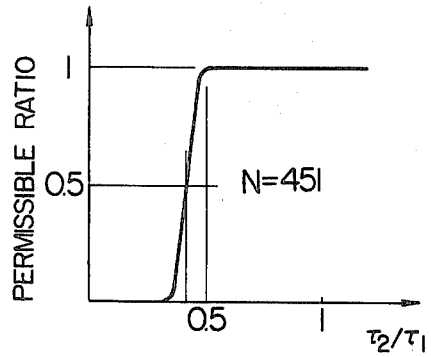
FIG. 5 is a graph showing the relation between the time constant and dv/dt firing capability.

The present inventors have found from the equation (14) that if the ratio of time constants $\tau_1$ and $\tau_2$ is brought within a constant range, the gate voltage $V_P$ of the thyristor can be restricted to the built-in voltage $V_B$. In accordance with such a proposal that if the plane patterns of the thyristor 1 and the transistor 30 have similarity, the characteristics of the thyristor 1 and transistor 30 (for example, time constants, $\tau_1$ and $\tau_2$) can be changed at a certain rate upon change of conditions, and the variation of the voltage $V_P$ can be made as small as possible, thereby preventing the thyristor 1 from being erroneously turned on, the inventors have produced a number of monolithic ICs of the circuit of FIG. 1 by the widely used bipolar process. In this case, the ICs thus produced have different ratio $\tau_2/\tau_1$ of the time constant $\tau_1$ of the thyristor 1 and the time constant $\tau_2$ of the transistor 30, and the relation between the ratio $\tau_2/\tau_1$ and the gate voltage $V_P$ has been confirmed by experiment. The number of measured elements was 451, and the gate voltage $V_P$ of each of a plurality of elements was measured at each $\tau_2/\tau_1$. In addition, the proportion of the elements whose gate voltage $V_P$ is lower than the built-in voltage $V_B$ (0.7 V) of the thyristor 1 was examined for each value of $\tau_2/\tau_1$. This proportion is referred to as the permissible ratio. FIG. 5 shows the measured results of the permissible ratio. It will be apparent from the figure that the permissible ratio is increased around 0.4 of the ratio $\tau_2/\tau_1$ and becomes 100% at the ratio of almost 0.5 or above. In other words, if the ratio $\tau_2/\tau_1$ is selected to be almost 0.5 or above, the erroneous firing of the thyristor 1 can be completely prevented.

On the other hand, if the absolute values of $\tau_2$ and $\tau_1$ are increased to a certain value or above, the thyristor loses its usefulness as a switch and thus the $\tau_2$ and $\tau_1$ have their upper limits. The time taken to operate a mechanical switch is normally about 1 to 5 milliseconds and thus the semiconductor switch must have $\tau_2$ and $\tau_1$ shorter than these values of the mechanical switch. Consequently, the absolute values of $\tau_1$ and $\tau_2$ are preferably lower than 1 milli-second.

Figure 1:
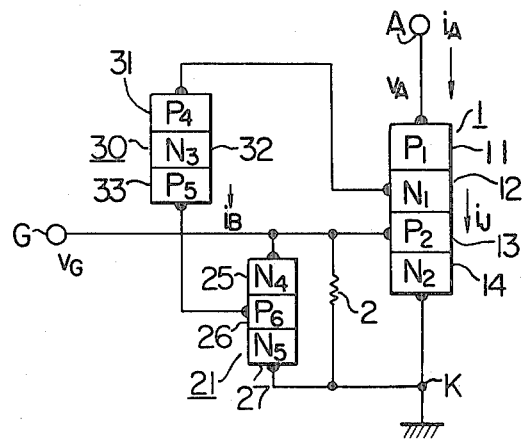
FIG. 1 is a circuit diagram of a typical example of the conventional semiconductor switch.
Figure 2:
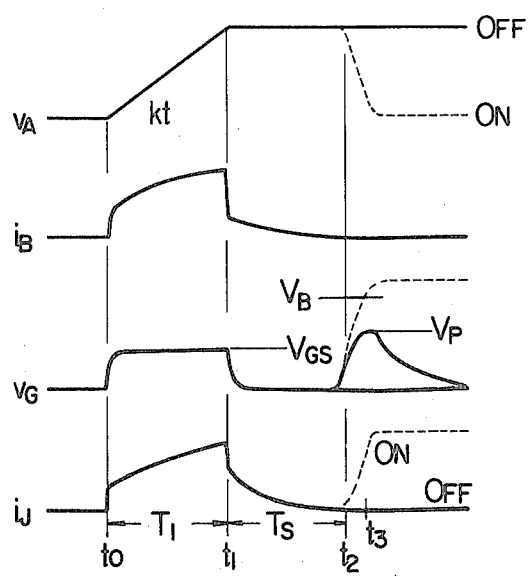
FIG. 2 is a waveform diagram of voltage and current at each part when a transient voltage is applied in the circuit of FIG. 1.
Figure 3:
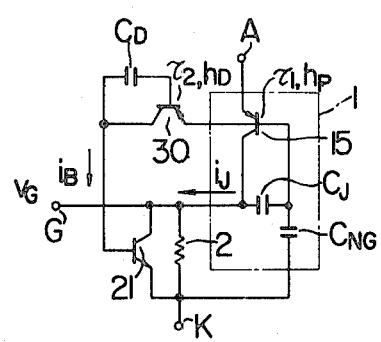
FIG. 3 shows an equivalent circuit of the circuit of FIG. 1.
Figure 4:
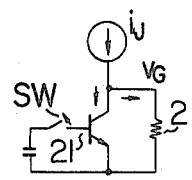
FIG. 4 shows an equivalent circuit when the circuit is operated.
Figure 6:
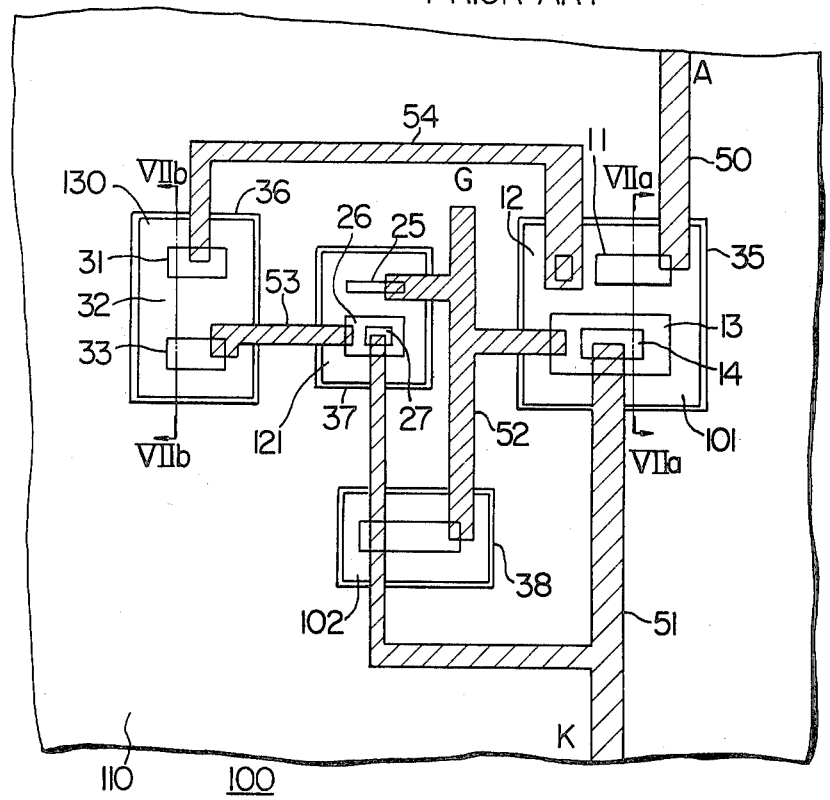
FIG. 6 is a plan view of a dielectric insulation separating substrate on which the circuit of FIG. 1 is integrated by the known method.
Figure 7A:
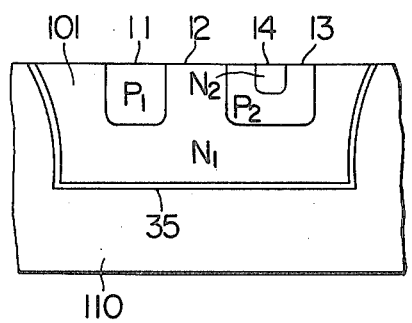
FIGS. 7A and 7B are longitudinal sections taken along lines VIIa–VIIa and VIIb–VIIb of FIG. 6, respectively.
Figure 7B:
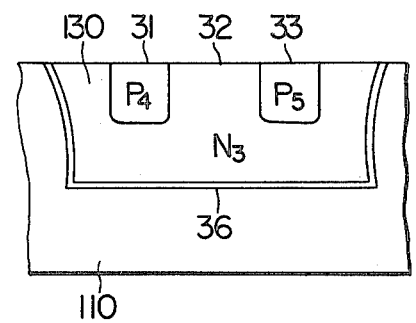

The electronic circuit of FIG. 1 is normally integrated as shown in FIG. 6. In FIG. 6, like elements corresponding to those of FIG. 1 are identified by the same reference numerals. FIGS. 7a and 7b are cross-sections of the thyristor 1 and the transistor 30 as the main components of FIG. 6, respectively.

In semiconductor single crystal island regions 101, 102, 121, and 130 of a dielectric insulation separating substrate 100 are integrated the thyristor 1, resistor 2, and transistors 21 and 30. The island regions are insulated from a semiconductor poly-crystal supporting region 110 through insulating films 35 to 38.

The thyristor 1 as shown in FIGS. 6 and 7A is of four-layer structure of $P_1N_1P_2N_2$ and the transistor 30 is of three-layer structure of $P_4N_3P_5$. The regions $N_1$ and $N_3$ of both the elements are the most fundamental layers, which are electrically insulated in the thyristor 1 and transient 30. Electrical signals to the respective elements do not interfere with each other. In the thyristor 101, as shown in FIG. 7A, the $N_2$ region 14 is formed in the $P_2$ region 13 by diffusion to complete $P_1N_1P_2N_2$ of the thyristor 1. In the transistor 130, as shown in FIG. 7B, the $P_4$ and $P_5$ regions 31 and 33 are formed at the same time in the $N_3$ region by diffusion to complete a PNP element.

In FIG. 6, interconnection between the elements is carried out by conductors 50, 51, 52, 53 and 54 which are indicated by the hatched areas in FIG. 5.

The NPN transistor 21 is also produced by substantially the same idea, and the resistor 2 can be produced by diffusing P-region in the fundamental region. This manufacturing process is the same as the known technique.

In the prior art, in FIG. 6, the structure of the thyristor 1 and transistor 30, particularly the plane pattern (diffused pattern) is not limited specially, and the transistor and thyristor have been designed to take practical pattern structure. For this reason, the characteristics of the thyristor and transistor (such as time constants) are changed due to the variation of various conditions so that the gate voltage $V_P$ is changed to cause erroneous firing.

The present invention proposes a specific way of bringing the $\tau_2/\tau_1$ ratio within a predetermined range, in which the PNP structure of the thyristor and the PNP structure of the transistor, particularly the diffused pattern of both the elements is designed to have similarity, thereby maintaining at a constant ratio the variation of the characteristics due to the change of various conditions of the elements. As a consequence, the gate voltage $V_P$ is kept below the built-in voltage $V_B$ of the thyristor and the variation of $V_P$ is minimized.

Figure 8A:
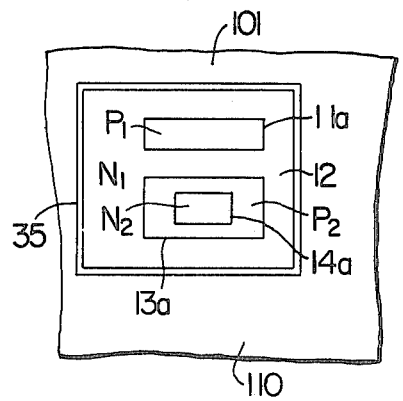
FIGS. 8A and 8B are plan views of a thyristor and a transistor showing one embodiment of the invention.
Figure 8B:
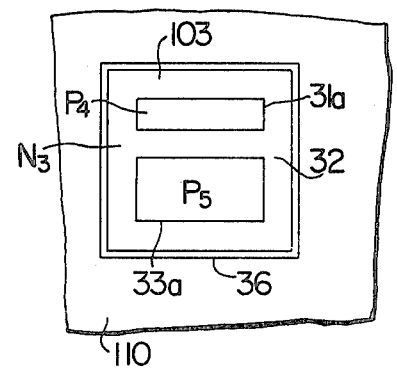

As described above, if $\tau_2/\tau_1$ is almost 0.5 or above, the thyristor can be prevented from erroneous firing. The condition of $\tau_2 \approx \tau_1$ can easily be realized for practical production by making same the plane patterns of the PNP (11, 12, 13) of the thyristor 1 and the PNP (31, 32, 33) of the transistor 30. FIGS. 8A and 8B are an embodiment of the present invention, in which the plane pattern of the PNP of the thyristor 1 is made geometrically equal to that of the PNP of the transistor 30 (here, the same shape is referred to as congruence). In other words, the P-type emitters (P$_1$) 11a (P$_4$) 31a of the thyristor 1 and transistor 30 are made to be of the same shape, the P-type collectors (P$_2$) 13a and (P$_5$) 33a thereof to be of the same shape, and the arrangement of the emitter P$_1$ and collector P$_2$ of the thyristor 1 to be the same as that of the emitter P$_4$ and collector P$_5$ of the transistor 30. The depth of the P$_1$ and P$_4$ layers is equal to that of the P$_2$ and P$_5$ layers.

Figure 9:
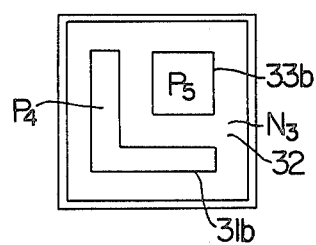
FIGS. 9 and 10 are modifications of the embodiments of FIGS. 8A and 8B, respectively.
Figure 10:
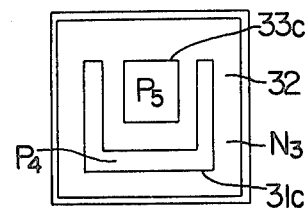

While the emitter and collector patterns of FIGS. 8A and 8B are of a strip-shape, the emitters may be of L-shape or U-shape as shown in FIGS. 9 and 10, respectively and the patterns of P$_1$ and P$_2$ may be the same as that of P$_4$ and P$_5$.

Upon making such patterns the physical size of the plane pattern can be very precisely formed with ease within one % error of area ratio or dimentional ratio.

The element structures of the thyristor 1 and transistor 30 are made congruent to have substantially the same values of time constants $\tau_1$ and $\tau_2$ and thus the gate voltage $V_P$ can be decreased to below the built-in voltage $V_B$ of the thyristor gate-cathode junction, thereby restricting the variation of the voltage $V_P$. That is, since the diffusion patterns of the thyristor 1 and transistor 30 are congruent, the time constant $\tau_2$ is increased or decreased by the almost same value with the increase or decrease of the time constant $\tau_1$ due to variation of various conditions, limiting the variation of the peak voltage $V_P$ to a very small value. If the peak voltage $V_P$ is little changed, it can be easily restricted to a certain value or below. Accordingly, by maintaining the $V_P$ at the gate-cathode conduction voltage $V_B$ (about 0.7 V) of the thyristor 1, it is possible to produce a semi-conductor switch of which the operation is almost not affected by noise voltage, particularly to substantially exclude improper operation due to variation of characteristics which has been a problem to be solved.

The case of $\tau_2/\tau_1 > 0.5$ will be mentioned below. To satisfy the condition, $\tau_2/\tau_1 > 0.5$, the plane pattern of the PNP structure of the thyristor 1 must be designed to be similar to that of the transistor 30. The first approach therefor will be described with reference to FIGS. 11A and 11B. FIGS. 11A and 11B show strip-shaped plane patterns of the emitters and collectors of the thyristor 1 and transistor 30. The ratio $\tau_2/\tau_1$ can be adjusted by changing only the pattern length of the emitters (P$_1$) 11d (P$_4$) 31d and collectors (P$_2$) 13d and (P$_5$) 33d. That is, $\tau_1$ depends on the length $l_3$ of P$_1$ and P$_2$, and $\tau_2$ on the length $l_4$ of P$_4$ and P$_5$. From the experimental results, it was found that if $l_4/l_3 > 0.2$, $\tau_2/\tau_1 > 0.5$ can be satisfied. In this case, it is assumed that the widths of P$_1$ and P$_4$ are equal, those of P$_2$ and P$_5$ equal and the distance $l_1$ between P$_1$ and P$_2$ of the thyristor 1 is equal to the distance $l_2$ between P$_4$ and P$_5$ of the transistor 30. In this construction, the emitter P$_4$ and collector P$_5$ of the transistor 30 can be made small and thus the transistor 30 can be small sized.

While the emitter P$_1$, P$_4$ pattern is of strip-shape here, L-shaped or U-shaped patterns or the like can be taken for the emitters in this embodiment.

The second approach for satisfying the condition $\tau_2/\tau_1 > 0.5$ is to take a proper ratio between the collector and emitter areas of the plane pattern in each of the thyristor and transistor. The time constant $\tau_1$ is normally determined by the ratio of the area S$_2$ of the emitter P$_2$ to the area S$_1$ of the collector P$_1$ of the thyristor 1, and the time constant $\tau_2$ by the ratio of the area S$_4$ of the emitter P$_5$ to the area S$_3$ of the collector P$_4$ of the transistor 30. Thus, as shown in FIGS. 12a and 12b, the area S$_2$ of the collector P$_2$ of the thyristor 1 as indicated by 13e can be made the same as the area S$_4$ of the collector P$_5$ of the transistor 30, and the ratio of the area S$_3$ of the emitter P$_4$ indicated by 31e to the area S$_1$ of the emitter P$_1$ indicated by 11e can be changed to adjust the ratio $\tau_2/\tau_1$. From the experimental results it is possible to satisfy the condition of $\tau_2/\tau_1 > 0.5$ by making the ratio S$_3$/S$_1$ be larger than 0.25. Although the patterns of the emitters P$_1$ and P$_4$ are formed in a strip-shape here, other patterns such as L-shape, U-shape or the like may be used for the patterns in this embodiment. Moreover, the areas of the emitters P$_1$ and P$_4$ may be made equal and the area ratio S$_4$/S$_2$ of the collectors P$_2$ and P$_5$ can be selected to be a certain value.

A third approach will next be described in which the condition, $\tau_2/\tau_1 > 0.5$ is satisfied by adjusting the ratio of the distance between the emitter P$_1$ and collector P$_2$ of the thyristor 1, and the distance between the emitter P$_4$ and collector P$_5$ of the transistor 30.

The time constant in the PNP pattern is normally approximately proportional to the square of the base width, or the distance between the two P-regions. Thus, in the strip-shaped emitters (P$_1$) 11f and (P$_4$) 31f of the thyristor 1 and the transistor 30 as shown in FIGS. 13A and 13B, by way of example, the emitter P$_1$ of the thyristor 1 and the emitter P$_4$ of the transistor 30 are made of the same shape, and the collectors (P$_2$) 13f and (P$_5$) 33f of the same shape. If the distance between the emitter P$_1$ and collector P$_3$ of the thyristor 1 is represented by W$_1$ and the distance between the emitter P$_4$ and collector P$_5$ of the transistor 30 by W$_2$, the condition of the $\tau_2/\tau_1 > 0.5$ can be satisfied under the condition, $W_1/W_2 > \sqrt{2}$.

This is also true for L-shaped or U-shaped emitter patterns P$_1$ and P$_4$. As shown in FIGS. 14A and 14B, when the emitters are of the L-shaped pattern, it is necessary to satisfy the condition, $W_3/W_4 < \sqrt{2}$, where W$_3$ is the distance between the emitter P$_1$ and the collector P$_2$, and W$_4$ the distance between the emitter P$_4$ and collector P$_5$. Also, as shown in FIGS. 15A and 15B, when the emitters are in the U-shape, it is necessary to satisfy the condition, $W_5/W_6 < \sqrt{2}$ where W$_5$ is the distance between the emitter (P$_1$) 11h and collector (P$_2$) 13h, and W$_6$ the distance between the emitter (P$_4$) 31h and collector (P$_5$) 33h.

In the above examples, the $P_1N_1P_2$ pattern of the thyristor 1 is the same as the $P_4N_3P_5$ of the transistor 30. Generally in the PNP pattern where the P-type emitter and the P-type collector have a constant width therebetween and the collector shapes are of the same dimentions, the time constant difference is present under change of emitter shape. The strip-shaped emitter gives the longest time constant, and the L-shaped and U-shaped emitters follow in the order of long time constant. Thus, a fourth approach for the condition of $\tau_2/\tau_1 > 0.5$ will be mentioned below. If the thyristor 1 and transistor 30 are designed so that the collectors $P_2$ and $P_5$ have the same dimentions, the width between $P_1$ and $P_2$ equals to that between $P_4$ and $P_5$ and the emitter $P_1$ is shaped in a strip form, and if the emitter $P_4$ is made in an L-shape or U-shape, the condition of $\tau_2/\tau_1 > 1$ can be satisfied.

Moreover, a combination of the first to fourth approaches can be selectively used for proper design of pattern of transistor 30 to satisfy the condition of $\tau_2/\tau_1 > 0.5$.

Thus, if the elements are constructed to have the similar shape, it is possible to obtain the time constants $\tau_1$ and $\tau_2$ of the thyristor 1 and transistor 30 the ratio of which is a predetermined value, thereby enabling the gate voltage $V_P$ to be maintained below the gate-cathode built-in voltage $V_B$ of the thyristor and to be prevented from variation. That is, since the thyristor 1 and transistor 30 have the same diffusion pattern, the time constant $\tau_2$ is increased or decreased with increase or decrease of the time constant $\tau_1$ due to variation of various conditions so that the ratio of the time constants is kept constant, and thus the peak voltage $V_P$ is almost prevented from change. If the change of the peak voltage $V_P$ is reduced, it is easily restricted to below a constant value. Thus, this peak voltage is kept below the gate-cathode conduction voltage (about 0.7 V) of the thyristor 1, thereby enabling the production of a semiconductor switch the operation of which is little affected by noise voltage, and particularly greatly reducing the generation of erroneous operation due to the variation of the characteristics which are inevitable in the prior art.

While the above embodiments are the application of the invention to the circuit of FIG. 1, the present invention may be applied to the circuits as shown in FIGS. 16 and 17 which are modifications of FIG. 1. In FIGS. 16 and 17, like elements corresponding to those of FIG. 1 are identified by the same reference numerals. In FIG. 16, between the base and emitter of the transistor 30 of FIG. 1 is connected a discharging diode 41 the anode of which is connected to the base of the transistor 30. A voltage clamping diode 42 is connected between the base and emitter of the transistor 21 with the anode connected to the emitter of the transistor 21. The diode 41 serves to discharge the charge stored in the junction capacitance of the transistor 30, and the diode 42 acts to prevent a reverse overvoltage from being applied between the base and emitter of the transistor 21 when a voltage is applied to the anode of the thyristor 1.

In FIG. 17, the emitter of the transistor 30 of FIG. 1 is connected to the anode of the thyristor 1 and the base thereof to the N-type base ($N_1$) 12 of the thyristor 1 through a discharging diode 43. The diode 43 acts to discharge the charge stored in the junction capacitance of the transistor 30.

In the application of the invention to the circuits of FIGS. 16 and 17, the patterns of the thyristor 1 and transistor 30 are the same as those of FIGS. 8A, 8B to 15A, 15B.

FIG. 18 shows the combination of two similar circuits one of which is as shown in FIG. 17. That is, a thyristor 45 of NPNP structure is added to the arrangement of FIG. 17, an NPN transistor 47 and a resistor 46 are connected in parallel between the gate and anode of the thyristor 45, and the transistor 47 has its base connected to the emitter of a bidirectional lateral transistor 30 and a voltage clamping diode 48 connected between the base and emitter thereof. The $N_1$ layer of the thyristor 1 and the $N_1$ layer of the thyristor 45 are made of a common N-layer.

In this arrangement, when a positive voltage is applied to the anode A, the current flows into the base of the transistor 21 thereby turning on it through $N_{11}$, $P_{11}$ of the thyristor 45, transistor 47 and transistor 30. The discharge current flows through the diode 42, transistor 30, diode 43 and $N_1$, $P_1$. When a positive voltage is applied to the cathode K, the current flows into the base of the transistor 47 thereby turning on it through the diode 42 and transistor 30. In this case, it is necessary that the $P_1N_1P_2$ layer pattern of the thyristor 1 and the pattern of the transistor 30 be of the same shape or congruent, and that the $P_{12}N_1P_{11}$ layer pattern of the thyristor 45 and the pattern of the transistor 30 be of the same shape or congruent.

FIG. 19 shows a circuit of a semiconductor switch similar to that shown in FIG. 1, according to the present invention.

The thyristor 1 is the same as that described previously. In this circuit, when the potential of the anode A is increased with respect to the cathode K, a transient current $i_p$ is flowed through an NPN transistor 60 consisting of ($N_6$) 63, ($P_7$) 62 and ($N_7$) 61 into a base 72 of a PNP transistor 70 consisting of ($P_8$) 73, ($N_8$) 72 and ($P_9$) 71. At this instant, the transistor 70 becomes in saturation between the collector 71 and emitter 73, thereby short-circuiting the junction between the N-base 12 and P-emitter 11 of the thyristor 1. That is, FIGS. 19 and 20 show the circuit arrangement of an embodiment of the invention using a complementary transistor to the transistor of FIG. 1.

The structure, $N_1P_2N_2$ of the thyristor 1 of FIG. 20 and the structure, $N_6P_7N_7$ of the transistor 60 are congruent or similar to each other as in FIGS. 8A, 8B to 15A, 15B. In other words, the N-base 12 is congruent or similar to the collector 61, the P-base 13 to the base 62, and the N-emitter 14 to the emitter 63. The pattern of the thyristor 1, bounded by a one-dot chain line is generally congruent or similar to the pattern of the transistor 60, bounded by one-dot chain line, and therefore the same effect as described previously can be expected.

Thus, according to the invention, the composite PNPN switch of FIG. 1, which has often been unstable in operation so far, can be greatly improved in its stability, and the design thereof can be performed with simplicity so that the semiconductor switch of the invention is very advantageous in industry.

FIGS. 19' and 20' show a modification of FIGS. 19 and 20. The circuit shown in FIG. 19' corresponds to that described above for FIG. 19 except for the fact that rather than the transistor region ($N_6$) 63 being connected to the base region ($P_2$) 13, it is coupled directly to the cathode electrode K itself. This is also shown in the layout diagram of FIG. 20'. The operation of the device illustrated in FIGS. 19' and 20' in short-circuiting the junction between the N base 12 and the P emitter 11 of the thyristor 1 will be the same as that described above for FIGS. 19 and 20.

Still another embodiment of the invention will next be described.

FIG. 21 shows a circuit arrangement of a composite PNPN switch used. In this case, P-region ($P_{10}$) 80 is provided in the N-base 12 of the thyristor 1 to form a $P_1N_1P_{10}$ structure which performs the same operation as that of the PNP transistor 30 of FIG. 1. The application of the invention to the circuit arrangement of FIG. 21 is the pattern structure as shown in FIG. 22.

FIG. 22 shows a plane, diffused pattern of the thyristor 1 in FIG. 21, in which the $P_1$ region 11 is the anode region. Inside the anode region 11, there are the P-base 13, N-emitter 14 and the region 80 corresponding to the collector.

As is evident from the pattern, the PNP ($P_1N_1P_2$) of the thyristor 1 and the PNP ($P_1N_1P_{10}$) of the transistor equivalent are symmetrical with respect to the one-dot chain line as shown and their patterns are considered to be congruent or similar to each other as in FIGS. 8A, 8B to 15A, 15B. Therefore, the equal or similar characteristics can be fully expected in both the PNP structures to which the present invention is applied.

While in the previous embodiments circuit elements such as thyristor, transistor and the like are integrated in a dielectric isolation separating substrate, such elements may be integrated in a known PN junction isolation separating substrate or air isolation separating substrate. Moreover, the present invention can be used not only for the monolithic integrated circuit but for the discrete-type integrated circuit.

Moreover, while in the above embodiments of FIGS. 19 and 21 a minimum number of elements necessary for a semiconductor switch are used for simplicity of explanation, other various circuit elements such as diodes can be incorporated therein according to different specification as in FIGS. 16 and 17.

Furthermore, other approaches for satisfying the condition of $\tau_2/\tau_1 > 0.5$ can be used instead of making similar or congruent plane diffused pattern; for example, adjusting the depth of P, N layer of the transistor and thyristor to control the time constants, or controlling the time constants of the thyristor and transistor by bombardment of electron beam with the depth of P, N layer kept the same.

We claim:

1. A semiconductor switch comprising:
   a thyristor of four semiconductor layers PNPN with three PN junctions and with anode, cathode and gate electrodes;
   a first transistor coupled to said thyristor to short-circuit at least one PN junction of said thyristor upon saturation of said first transistor; and
   a second transistor provided between the anode side of said thyristor and the base of said first transistor to cause the saturation of said first transistor in accordance with a voltage which is applied to the anode of the thyristor, wherein three continuous layers with two PN junctions of said thyristor of the PNPN structure constitute a third transistor, and further wherein said second transistor has a three-layer structure having a plane diffused pattern similar to a plane diffused pattern of said three-layer structure third transistor.

2. A semiconductor switch according to claim 1, wherein said thyristor is of four-layer PNPN structure toward said cathode from said anode, said first transistor is of three-layer NPN structure, said second transistor is of three-layer PNP structure, and a third transistor comprised of the three continuous layers PNP of said thyristor of PNPN structure has a plane diffused pattern similar to that of said second transistor of three-layer PNP structure.

3. A semiconductor switch according to claim 1, wherein said thyristor is of four-layer PNPN structure toward said cathode from said anode, said first transistor is of three-layer PNP structure, said second transistor is of three layer NPN structure, and a third transistor comprised of the three continuous layers NPN of said thyristor has a plane diffused pattern similar to that of said second transistor of three-layer NPN structure.

4. A semiconductor switch according to claim 1, wherein one intermediate layer of the four semiconductor layers of said thyristor is provided with a gate electrode, the other intermediate layer is provided with a fifth semiconductor layer the conductivity type of which is different from that of the former intermediate layer, thus the end layer as the anode of said thyristor constituting said second transistor together with the other intermediate layer and the fifth semiconductor layer, and a third transistor comprised of said end layer of the thyristor, and both the intermediate layers has a plane diffused pattern similar to that of said second transistor.

5. A semiconductor switch according to claim 2, 3 or 4, wherein said second and third transistors have the same plane diffused pattern, and the time constant of said thyristor equals to that of said second transistor.

6. A semiconductor switch according to claim 2, 3, or 4, wherein the emitters of said second and third transistors take a strip-shape in their plane diffused patterns, and the ratio of the length of the emitter of said second transistor to that of said third transistor is substantially 0.2 or above.

7. A semiconductor switch according to claim 2, 3 or 4, wherein in the plane diffused patterns of said second and third transistors, the ratio of the emitter area of said second transistor to that of said third transistor is substantially 0.25 or above.

8. A semiconductor switch according to claim 2, 3 or 4, wherein in the plane diffused patterns of said second and third transistors, the ratio of the base width of said second transistor to that of said third transistor is substantially $1/\sqrt{2}$ or above.

9. A semiconductor switch according to claim 2, 3 or 4, wherein in the plane diffused patterns of said second and third transistors, the emitter of said third transistor takes a strip-shape and the emitter of said second transistor takes an L-shape or U-shape.

10. A semiconductor switch comprising:
    a thyristor of four semiconductor layers PNPN with three PN junctions and with anode, cathode and gate electrodes;
    a first transistor coupled to said thyristor to short-circuit at least one PN junction of said thyristor upon saturation of said first transistor; and
    a second transistor provided between the cathode side of said thyristor and the base of said first transistor to cause the saturation of said first transistor in accordance with a voltage which is applied to the cathode of the thyristor, wherein three continuous layers with two PN junctions of said thyristor of the PNPN structure constitute a third transistor, and further wherein said second transistor has a three-layer structure having a plane diffused pattern similar to a plane diffused pattern of said three-layer structure third transistor.

11. A semiconductor switch according to claim 1 or 10, wherein the ratio of a time constant of said second transistor to a time constant of said thyristor is not less than about 0.5.

12. A semiconductor switch according to claim 10, wherein said thyristor is of four-layer PNPN structure toward said cathode from said anode, said first transistor is of three-layer NPN structure, said second transistor is of three-layer PNP structure, and a third transistor comprised of the three continuous layers PNP of said thyristor of PNPN structure has a plane diffused pattern similar to that of said second transistor of three-layer PNP structure.

13. A semiconductor switch according to claim 10, wherein said thyristor is of four-layer PNPN structure toward said cathode from said anode, said first transistor is of three-layer PNP structure, said second transistor is of three-layer NPN structure, and a third transistor comprised of the three continuous layers NPN of said thyristor has a plane diffused pattern similar to that of said second transistor of three-layer NPN structure.

14. A semiconductor switch according to claim 10, wherein one intermediate layer of the four semiconductor layers of said thyristor is provided with a gate electrode, the other intermediate layer is provided with a fifth semiconductor layer, the conductivity type of which is different from that of the former intermediate layer, thus the end layer as the anode of said thyristor constituting said second transistor together with the other intermediate layer and the fifth semiconductor layer, and a third transistor comprised of said end layer of the thyristor, and both the intermediate layers has a plane diffused pattern similar to that of said second transistor.

15. A semiconductor switch according to claim 12, 13 or 14, wherein said second and third transistors have the same plane diffused pattern, and the time constant of said thyristor equals to that of said second transistor.

16. A semiconductor switch according to claim 12, 13 or 14, wherein the emitters of said second and third transistors take a strip-shape in their plane diffused patterns, and the ratio of the length of the emitter of said second transistor to that of said third transistor is substantially 0.2 or above.

17. A semiconductor switch according to claim 12, 13 or 14, wherein in the plane diffused patterns of said second and third transistors, the ratio of the emitter area of said second transistor to that of said third transistor is substantially 0.25 or above.

18. A semiconductor switch according to claim 12, 13 or 14, wherein in the plane diffused patterns of said second and third transistors, the ratio of the base width of said second transistor to that of said third transistor is substantially $1/\sqrt{2}$ or above.

19. A semiconductor switch according to claim 12, 13 or 14, wherein in the plane diffused patterns of said second and third transistors, the emitter of said third transistor takes a strip-shape and the emitter of said second transistor takes an L-shape or U-shape.

20. A semiconductor switch according to claim 1 or 10, wherein said plane pattern of said second transistor is congruent with said plane pattern of said third transistor.

* * * * *